United States Patent [19]
Edo

[11] Patent Number: 5,923,157
[45] Date of Patent: Jul. 13, 1999

[54] SEMICONDUCTOR DEVICE CAPABLE OF DECREASING AN INTERNAL VOLTAGE IN PERIOD OF ACCELERATION TEST

[75] Inventor: Yasuhiro Edo, Tokyo, Japan

[73] Assignee: NEC Corporation, Tokyo, Japan

[21] Appl. No.: 08/856,802

[22] Filed: May 15, 1997

[30] Foreign Application Priority Data

May 17, 1996 [JP] Japan ................................. 8-148151

[51] Int. Cl.⁶ .............................. G05F 1/40; G05F 1/10; G05F 3/02; G11C 8/00
[52] U.S. Cl. .......................... 323/282; 327/538; 327/543; 365/226
[58] Field of Search .................... 327/538, 540, 327/541, 543; 365/233.5, 226; 323/282

[56] References Cited

U.S. PATENT DOCUMENTS

| | | | |
|---|---|---|---|
| 4,950,921 | 8/1990 | Takada | 327/566 |
| 5,025,422 | 6/1991 | Moriwaki et al. | 365/233.5 |
| 5,400,290 | 3/1995 | Suma et al. | 365/226 |
| 5,424,629 | 6/1995 | Fujiwara et al. | 327/538 |
| 5,426,616 | 6/1995 | Kajigaya et al. | 365/226 |
| 5,451,896 | 9/1995 | Mori | 327/543 |
| 5,694,364 | 12/1997 | Morishita et al. | 365/226 |

FOREIGN PATENT DOCUMENTS 4-115562  4/1992  Japan .

OTHER PUBLICATIONS

Japanese Office Action Dated Jun. 9, 1998 with English language translation of Japanese Examiner's comments.

*Primary Examiner*—Stuart N. Hecker
*Assistant Examiner*—Bao Q. Vu
*Attorney, Agent, or Firm*—Whitham, Curtis & Whitham

[57] ABSTRACT

In a semiconductor device comprises an internal circuit and which is supplied with an external voltage, the internal circuit is operated in an internal voltage having a high internal level and a low internal level. A voltage decreasing circuit decreases the high internal level of the internal voltage. A controlling circuit controls decrease of the internal voltage in response to an external control signal OEB.

5 Claims, 10 Drawing Sheets

SEMICONDUCTOR DEVICE CAPABLE OF DECREASING AN INTERNAL VOLTAGE IN PERIOD OF ACCELERATION TEST

BACKGROUND OF THE INVENTION

This invention relates to a semiconductor device, and more particularly, to a semiconductor memory device which comprises an internal voltage decreasing circuit.

DESCRIPTION OF THE RELATED ART

A first conventional semiconductor device of the type described is disclosed in Japanese Unexamined Patent Prepublication (koukai) No. 115562/1992. In the manner which will be described more in detail, the first conventional semiconductor device comprises a voltage decreasing circuit for decreasing an internal voltage of an internal circuit, a test high voltage detecting circuit for detecting whether or not an external voltage is a test high voltage, and a circumventing circuit for circumventing operation of decreasing voltage in the voltage decreasing circuit.

In the manner which will be described more in detail, a second conventional semiconductor device of the type described comprises a voltage decreasing circuit for decreasing an internal voltage of an internal circuit and an internal voltage changing circuit for changing the internal voltage when the external voltage is higher than a predetermined voltage. In a present acceleration test, an acceleration test device which comprises a test facility for convergence determination is used.

However, since the conventional semiconductor devices do not comprise a voltage decreasing device which decreases the internal voltage of the internal circuit in a period of the acceleration test, the acceleration test is, in the middle, interrupted and a convergence determination test must be carried out. Therefore, an actual period for the acceleration test which is carried by the acceleration test device is equal to a period which is obtained by adding the period of the acceleration test to that of the convergence determination test. Also, in order to accurately carry out the convergence determination, frequency of the convergence determination test must be increased. Therefore, the conventional semiconductor devices have an disadvantage that a total period which is needed for the acceleration test is greater.

SUMMARY OF THE INVENTION

It is therefore an object of this invention to provide a semiconductor device which comprises a voltage decreasing device which decreases an internal voltage of an internal circuit in a period of an acceleration test.

It is another object of this invention to provide a semiconductor device which is capable of increasing a total period which is needed for an acceleration test.

Other objects of this invention will become clear as the description proceeds.

According to a first aspect of this invention, there is provided a semiconductor device which comprises an internal circuit and which is supplied with an external voltage, the internal circuit being operated in an internal voltage having a high internal level and a low internal level, the semiconductor device comprising;

voltage switching means for switching, in response to an external control signal, from the high internal level to the low internal level and for switching, in response to the external control signal, from the low internal level to the high internal level when the external voltage is higher than a predetermined voltage.

According to a second aspect of this invention, there is provided a semiconductor device which comprises an internal circuit and which is supplied with an external voltage, the internal circuit being operated in an internal voltage having a high internal level and a lowinternal level, the semiconductor device comprising;

circumventing means for circumventing, in response to an external control signal, change of the internal voltage regardless of the external voltage.

According to a third aspect of this invention, there is provided a semiconductor device which comprises an internal circuit and which is supplied with an external voltage, the internal circuit being operated in an internal voltage having a high internal level and a low internal level, the semiconductor device comprising;

voltage decreasing means for decreasing the high internal level of the internal voltage; and controlling means for controlling decrease of the internal voltage in response to an external control signal.

According to a fourth aspect of this invention, there is provided a semiconductor device which comprises an internal circuit and which is supplied with an external voltage, the internal circuit being operated in an internal voltage having a high internal level and a lowinternal level, the semiconductor device comprising;

voltage decreasing means for decreasing the high internal level of the internal voltage;

external voltage detecting means for detecting that the external voltage is higher than a predetermined voltage;

controlling means for controlling, in response to an external control signal, the voltage decreasing means to decrease the internal voltage when the external voltage detecting means detects that the external voltage is higher than the predetermined voltage; and circumventing means for circumventing detection of the external voltage detecting means when the external voltage is higher than the predetermined voltage.

DESCRIPTION OF THE PREFERRED EMBODIMENTS

Figure 1:
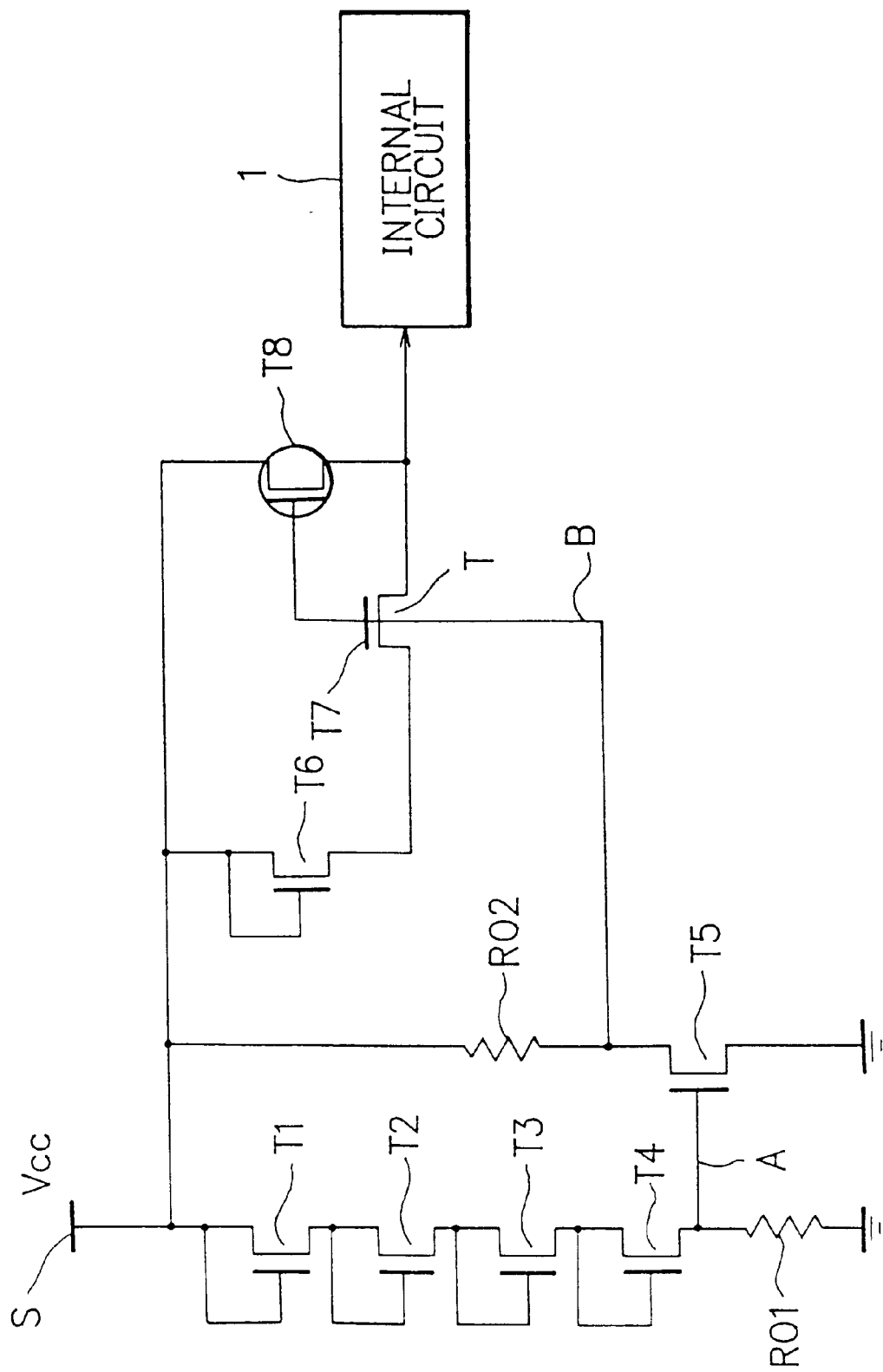
FIG. 1 is a block diagram of a first conventional semiconductor device.
Figure 2:
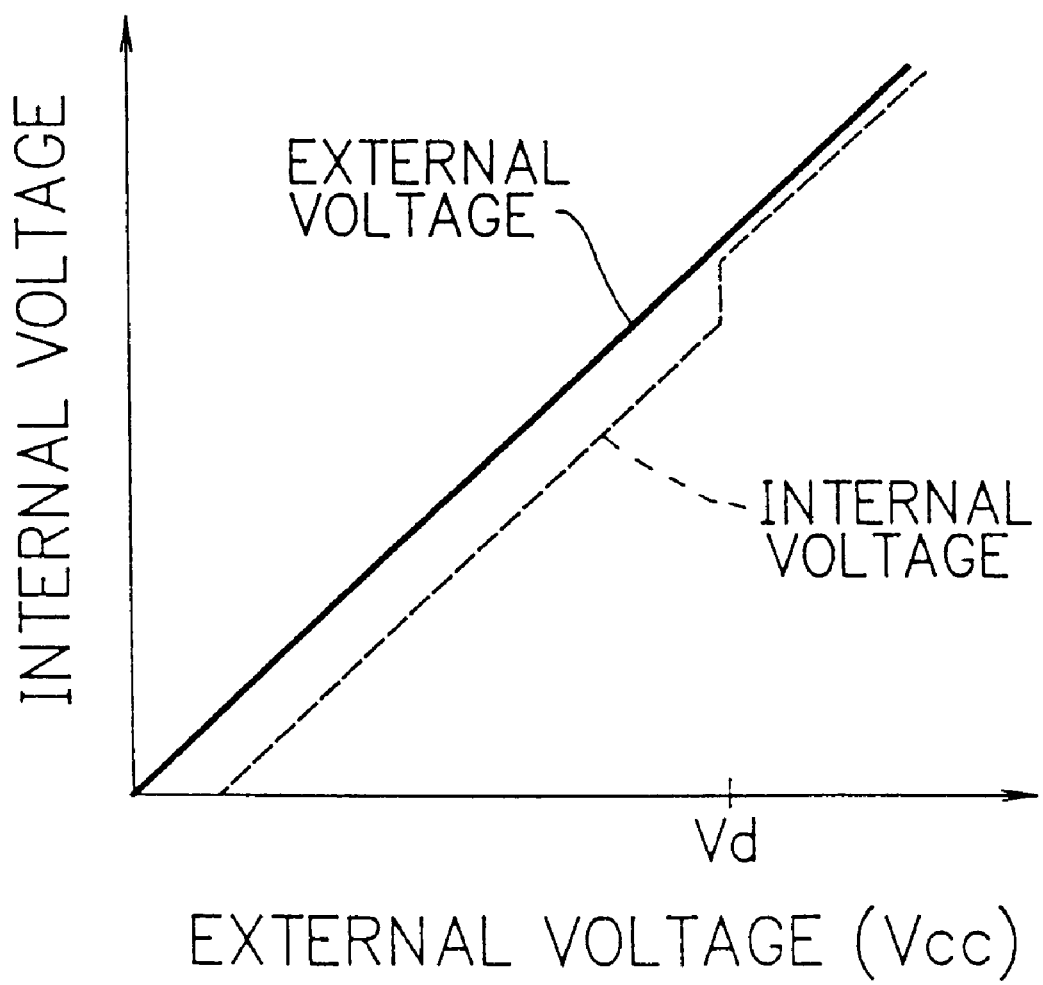
FIG. 2 is a view for use in describing operation of the first conventional semiconductor device illustrated in FIG. 1.
Figure 3:
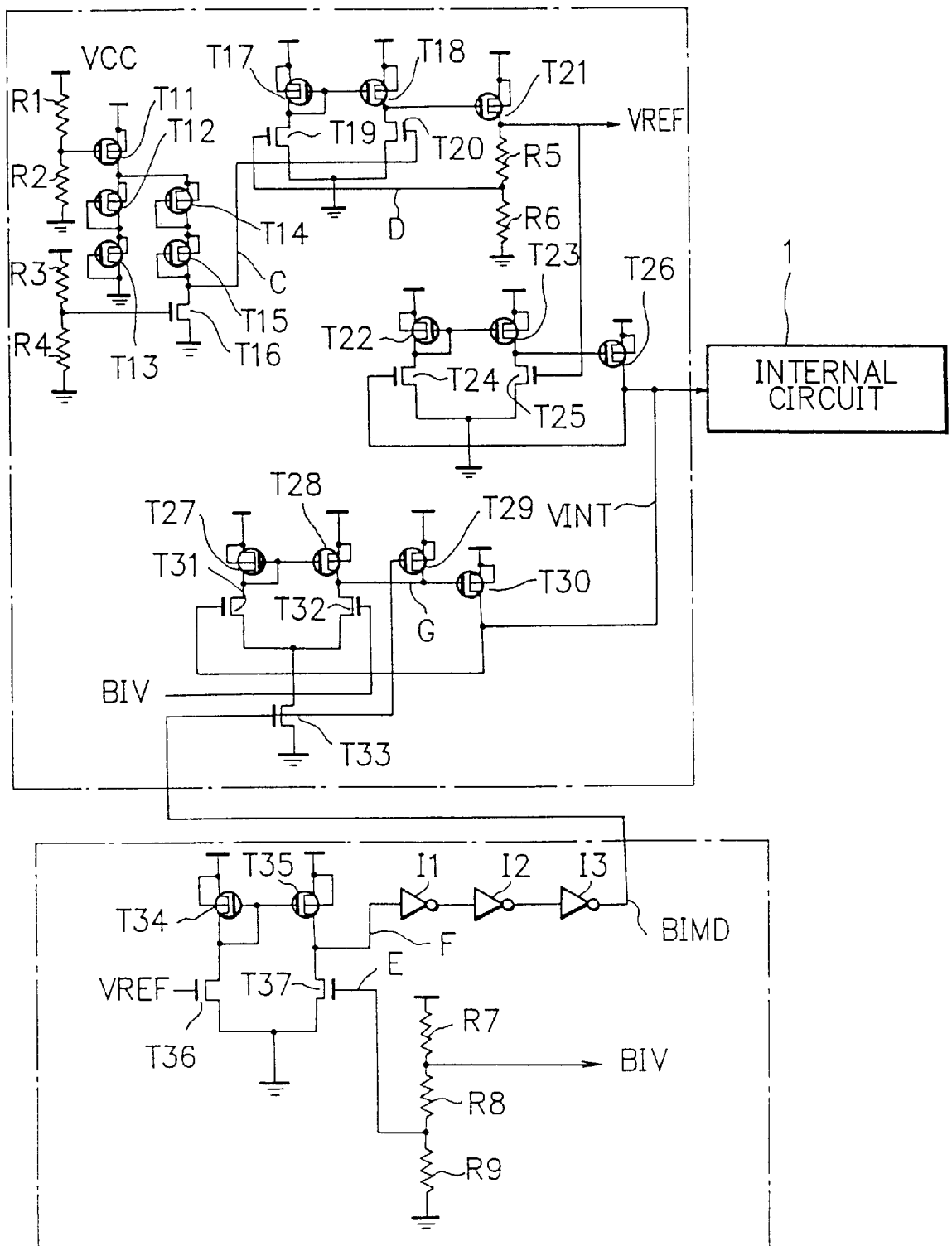
FIG. 3 is a circuit diagram of a second conventional semiconductor device.

Referring to FIGS. 1, 2, 3. 4, 5, and 6, first and second conventional semiconductor devices will be described for a better understanding of this invention.

In FIG. 1, the first conventional semiconductor device comprises N-channel metal oxide semiconductor transistors (N-channel MOSTs) T1 to T4 which are serially connected between an external supply terminal S and a resistor RO1. The external supply terminal S is supplied with an external voltage Vcc. The resistor R1 is connected to the N-channel MOST T4 through a node A. A resistor R2 is connected to the external supply terminal S. A N-channel MOST T5 is connected to the resistor RO2 through a node B. The node A is connected to a gate electrode of the N-channel MOST T5. An internal circuit 1 is connected to the external supply terminal S through a N-channel MOST T6 and a N-channel MOST T7 which are serially connected. A P-channel metal oxide semiconductor transistor (P-channel MOST) T8 is, in parallel, connected to the N-channel MOSTs T6 and T7. The node B is connected to gate electrodes of the N-channel MOST T7 and the P-channel MOST T8.

When the external voltage Vcc becomes a high level which is higher than a level of a predetermined voltage Vd, a voltage of the node A is changed from a low level to a high level. As a result, the N-channel MOST T5 becomes on. Therefore, a voltage of the node B is changed from the high level to the low level and the N-channel MOST T7 becomes off. In addition, the P-channel MOST T8 becomes on. As a result, an internal voltage of the internal circuit 1 which is connected to a drain electrode of the P-channel MOST T8 is increased as shown in FIG. 2.

In FIG. 3, the second conventional semiconductor device comprises P-channel MOSTs T11 to T15, T17, T18, T21 to T23, T26 to T30, T34, and T34, N-channel MOSTs T16, T19, T20, T24, T25, T31 to T33, T36, and T37, resistors R1 to R9, inverters I1 to I3, and the internal circuit 1. The P-channel MOSTs T11 to T13 are serially connected between the external supply terminal and the ground. The P-channel MOSTs T14 and T13 and the N-channel MOST T16 are serially connected between a node of the P-channel MOSTs T11 and T11 and the ground. A node of the resistors R1 and R2 is connected to a gate electrode of the P-channel MOST T11. A node of the resistors R3 and R4 is connected to a gate electrode of the N-channel MOST T16. A node C the P-channel MOSTs T15 and the N-channel MOST T16 is connected to a gate electrode of the N-channel MOST T20.

The P-channel MOST T17 and the N-channel MOST T19 are serially connected between the external supply terminal and the ground. The P-channel MOST T18 and the N-channel MOST T20 are serially connected between the external supply terminal and the ground. A gate electrode of the P-channel MOST T17 is connected to a gate electrode of the P-channel MOST T18. The P-channel MOST T21 and the resistors R5 and R6 are serially connected between the external supply terminal and the ground. A node of the P-channel MOST T18 and the N-channel MOST T20 is connected to a gate electrode of the P-channel MOST T21. A node of the resistors R5 and R6 is connected to a gate electrode of the N-channel MOST T19.

A node of the P-channel MOST T21 and the resistor R5 is connected to a gate electrode of the P-channel MOST T25. A voltage VREF of the node of the P-channel MOST T21 and the resistor R5 is supplied to the gate electrode of the P-channel MOST T25. The P-channel MOST T22 and the N-channel MOST T24 are serially connected between the external supply terminal and the ground. The P-channel MOST T23 and the N-channel MOST T25 are serially connected between the external supply terminal and the ground. A gate electrode of the P-channel MOST T22 is connected to a gate electrode of the P-channel MOST T23. The P-channel MOST T26 is connected between the external supply terminal and a gate electrode of the N-channel MOST T24. A node of the P-channel MOST T23 and the N-channel MOST T25 is connected to a gate electrode of the P-channel MOST T26. A drain electrode of the P-channel MOST T26 is connected to the internal circuit 1.

The P-channel MOST T27, the N-channel MOST T31, and the N-channel MOST T33 are serially connected between the external supply terminal and the ground. The P-channel MOST T28 and the N-channel MOST T32 are serially connected between the external supply terminal and a node of the N-channel MOST T31 and the N-channel MOST T33. A gate electrode of the P-channel MOST T27 is connected to a gate electrode of the P-channel MOST T28. The P-channel MOST T30 is connected to the external supply terminal and the drain electrode of the P-channel MOST T26. A drain electrode of the P-channel MOST T30 is connected to a gate electrode of the N-channel MOST T31. A voltage of the drain electrode of the P-channel MOST T30 is supplied to the internal circuit 1 as a internal voltage VINT. A node G of the P-channel MOST T28 and the N-channel MOST T32 is connected to a gate electrode of the P-channel MOST T30. The P-channel MOST T29 is connected between the external supply terminal and the node of the P-channel MOST T28 and the N-channel MOST T32. A voltage BIV is supplied to a gate electrode of the N-channel MOST T32. A voltage BIMD is supplied to gate electrodes of the P-channel MOST T29 and the N-channel MOST T33.

The P-channel MOST T34 and the N-channel MOST T36 are serially connected between the external supply terminal and the ground. The P-channel MOST T35 and the N-channel MOST T37 are serially connected between the external supply terminal and the ground. A gate electrode of the P-channel MOST T34 is connected to a gate electrode of the P-channel MOST T35. The resistors R7 to R9 are serially connected between the external supply terminal and the ground. A gate electrode of the N-channel MOST T37 is connected to a node of the resistors R8 to R9. A node of the resistors R7 and R8 is supplied to the gate electrode of the N-channel MOST T32 as the voltage BIV. The inverters I1 to I3 are serially connected between a node of the P-channel MOST T35 and the N-channel MOST T37 and the gate electrodes of the P-channel MOST T29 and the N-channel MOST T33. A voltage of the inverter I3 is supplied to the gate electrodes of the P-channel MOST T29 and the N-channel MOST T33 as the voltage BIMD.

The P-channel MOSTs T12 and T13 have thresholds which are higher than that of the P-channel MOSTs T14 and T15. A voltage of the node C is supplied to the gate electrode of the N-channel MOST T20. A voltage of the node D is supplied to the gate electrode of the N-channel MOST T19. The N-channel MOSTs T19 and T20 implement a differential pair device. The N-channel MOSTs T19 and T20 compare the voltage of the node C with the voltage of the node D to control the voltage VREF by making the P-channel MOST T21 become on so that the voltage of the node C becomes equal to the voltage of the node D.

On the other hand, a voltage of the node E is supplied to the N-channel MOST T37. The voltage VREF is supplied to the N-channel MOST T36. The N-channel MOST T36 and the N-channel MOST T37 compare the voltage VREF with the voltage of the node E. When the external voltage Vcc is lower than the predetermined voltage Vd, resistances of the resistors R7 to R9 are set so that the voltage of the node E is continually lower than the voltage VREF. Therefore, the voltage of the node E becomes the high level. Also, the voltage BIMD is held at the low level.

Figure 4:
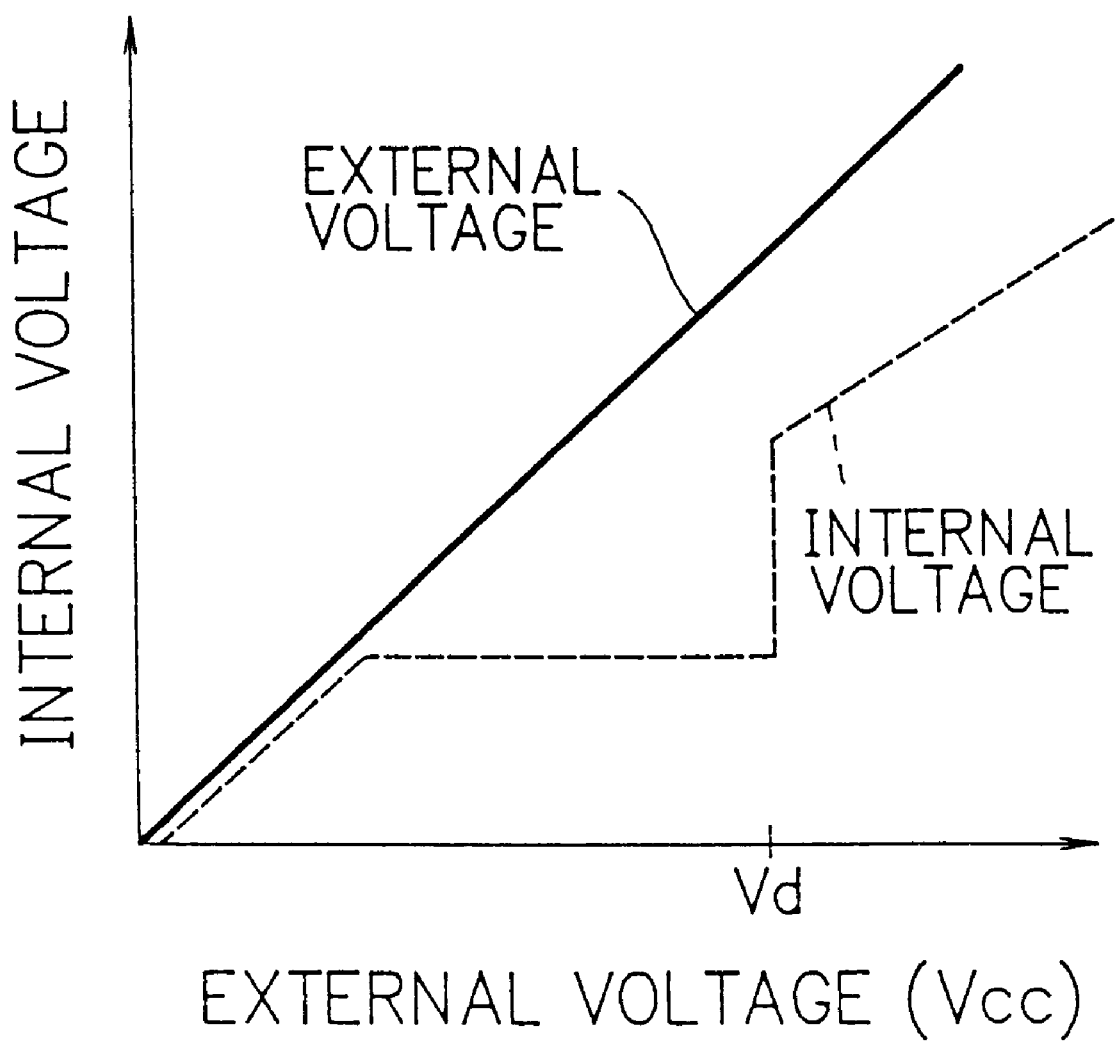
FIG. 4 is a view for use in describing operation of the second conventional semiconductor device illustrated in FIG. 3.
Figure 5:
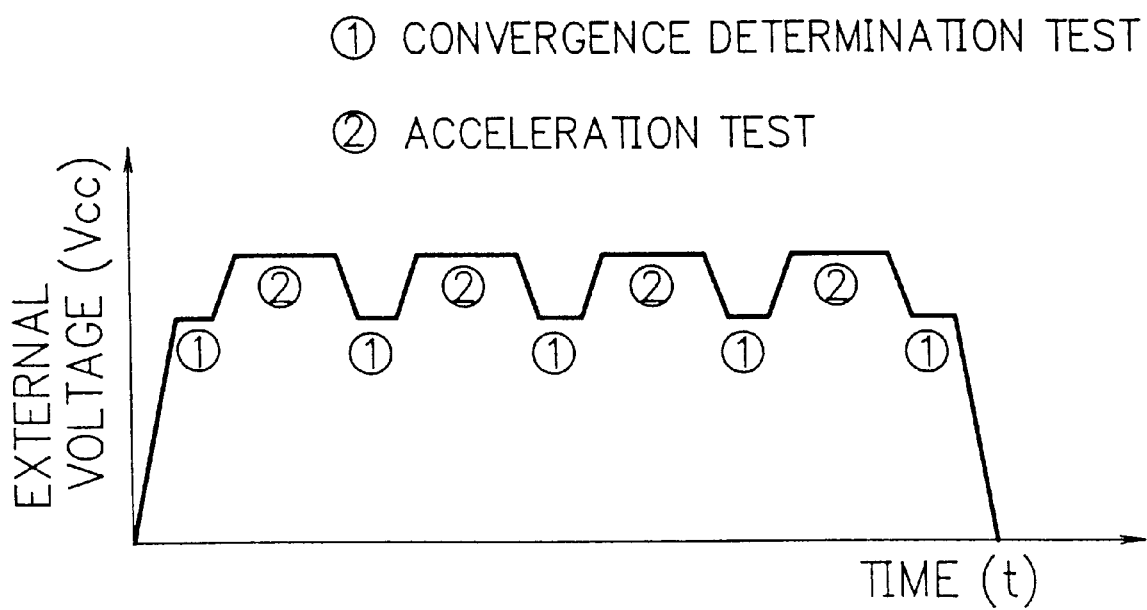
FIG. 5 is a view for use in describing operation of the first and second conventional semiconductor devices illustrated in FIGS. 1 and 3.

When the voltage BIMD is held at the low level, the N-channel MOST T33 is off and the P-channel MOST T29 is on. Therefore, the voltage of the node G is continually held at the low level. Also, the voltage VINT for the internal circuit 1 is not changed when the external voltage Vcc is lower than the predetermined voltage Vd as shown in FIG. 4.

In case of carrying out an acceleration test, the external voltage Vcc is set a voltage which is higher than the predetermined voltage Vd. Since the voltage of the node E is set at a which is higher than the voltage VREF, the voltage of the node F is changed from the high level to the low level when the external voltage Vcc is higher than the predetermined voltage Vd. As a result, since an output signal of the inverter I1 is inverted, the voltage BIMD is finally changed from the low level to the high level.

When the voltage BIMD becomes the high level, the N-channel MOST T33 becomes on. As a result, the N-channel MOSTs T31 and T32 compare the voltage BIV with the internal voltage VINT. The internal voltage VINT is controlled to be equal to the voltage BIV by the P-channel MOST T30 which is, as a gate input, supplied with a voltage of the drain electrode of the P-channel MOST T28 which is an active load of the N-channel MOSTs T31 and T32. When the external voltage Vcc is higher than the predetermined voltage Vd, the voltage BIV is higher than the voltage VREF. The internal voltage VINT is finally changed when the external voltage Vcc is higher than the predetermined voltage Vd as shown in FIG. 4. Thus, in case of effectively carrying out the acceleration test, it needs that the voltage which is supplied to the transistor. In a present acceleration test, an acceleration test device which comprises a test facility for convergence determination is used.

However, since the conventional semiconductor devices do not comprise a voltage decreasing device which decreases the internal voltage of the internal circuit 1 in a period of the acceleration test or BT (burn-in test), the acceleration test is, in the middle, interrupted and a convergence determination test must be carried out. Therefore, an actual period for the acceleration test which is carried by the acceleration test device is equal to a period which is obtained by adding the period of the acceleration test to the convergence determination test. Also, in order to accurately carry out the convergence determination, frequency of the the convergence determination test must be increased. Therefore, the conventional semiconductor devices have an disadvantage that a total period which is needed for the acceleration test is greater.

Figure 6:
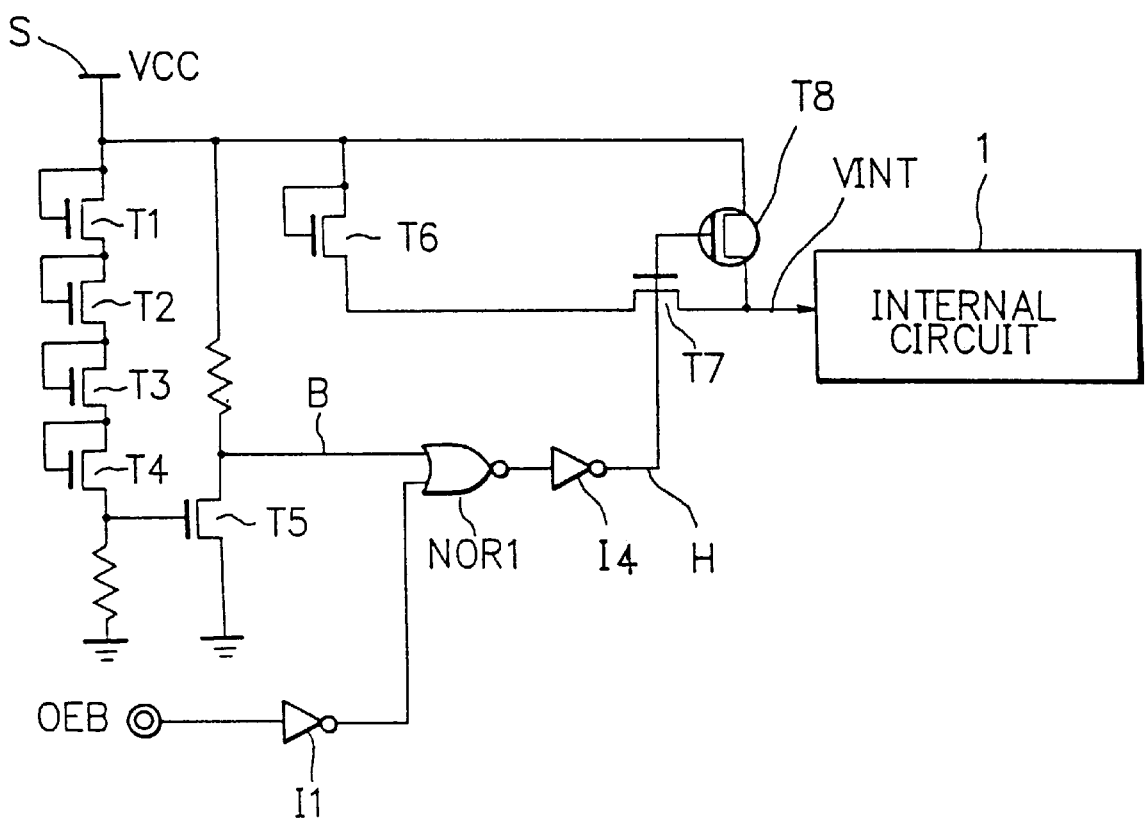
FIG. 6 is a circuit diagram of a semiconductor device according to a first embodiment of this invention.

Referring to FIG. 6, the description will proceed to a semiconductor device according to a first embodiment of this invention. Similar parts are designated by like reference numerals.

The semiconductor device comprises the N-channel MOSTs T1 to T7, the resistors RO1 and RO2, the P-channel MOST T8, and the internal circuit 1. The node B is connected to an input terminal of a NOT OR gate circuit NOR1. Another input terminal of the NOT OR gate circuit NOR1 is connected to an inverter I4. The inverter I4 is supplied with an external control signal OEB which has a high level and a low level. An output terminal of the NOT OR gate circuit NOR1 is connected to the gate electrodes of the N-channel MOST T7 and the P-channel MOST T8 through an inverter I5. The inverter I5 is connected to the gate electrodes of the N-channel MOST T7 and the P-channel MOST T8 through a node H.

When the external voltage Vcc is lower than the predetermined Vd, the N-channel MOST T5 is off. As a result, the voltage of the node B is the high level. An output voltage of the NOT OR gate circuit NOR1 is held at the low level regardless of the external control signal OEB. Since a voltage of the node H is the high level when the external voltage Vcc is lower than the predetermined Vd, the N-channel MOST T7 is on and the P-channel MOST T8 is off. Therefore, the internal voltage VINT which is supplied to the internal circuit 1 is a voltage which is decreased by the N-channel MOST T6 which is supplied with the external voltage Vcc. Namely, the internal voltage VINT is the low level.

In case of carrying out the acceleration test, the external voltage Vcc is set at a voltage which is higher than the predetermined voltage Vd. In this event, the N-channel MOST T5 becomes on and the voltage of the node B is changed from the high level to the low level. On the other hand, when the external control signal OEB is the high level, the low level of the voltage from the inverter I4 is supplied to the NOT OR gate circuit NOR1. As a result, since the NOT OR gate circuit NOR1 having two input terminal is supplied with the low level, an output voltage of the NOT OR gate circuit NOR1 becomes the high level and the voltage of the node H becomes the low level. When the voltage of the node H is changed from the high level to the low level, the P-channel MOST T8 becomes on. Therefore, the internal voltage VINT is changed in the same manner with the external voltage Vcc as shown in FIG. 2.

On the other hand, when the external control signal OEM is changed from the high level to the low level when the external voltage Vcc is higher than the predetermined Vd, the high level from the inverter I4 is supplied to the NOT OR gate circuit NOR1. As a result, the output voltage of the NOT OR gate circuit NOR1 is inverted and the voltage of the node H is changed from the low level to the high level. Therefore, since the N-channel MOST T7 becomes on, the internal voltage VINT is the voltage which is decreased by the N-channel MOST T6 which is supplied with the external voltage Vcc.

Generally, the acceleration test is carried out setting the external voltage Vcc at a voltage higher than the predetermined voltage Vd. However, since the internal voltage becomes higher than a normal operation voltage, it is impossible to assure that normal data are read by operation in the internal voltage. Therefore, in the conventional semiconductor devices, it is difficult to accurately determine, by the determination test, whether or not the semiconductor device becomes wrong.

However, the semiconductor device of this invention is capable of carrying out the determination test with the external voltage Vcc held at the constant. As a result, the semiconductor device of this invention is capable of decreasing the total period of the acceleration test.

Figure 7:
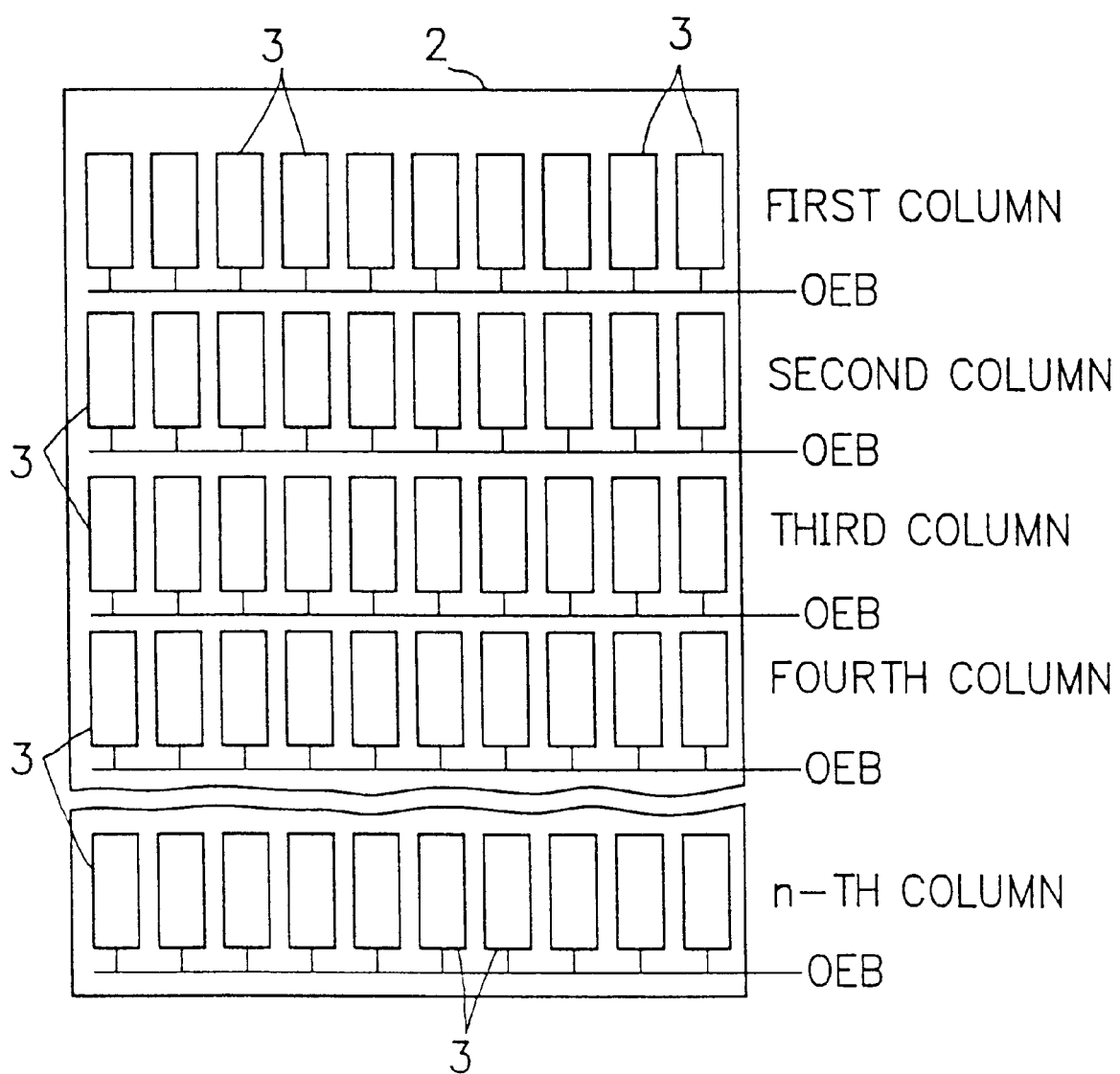
FIG. 7 is a view for use in describing operation of the semiconductor device illustrated in FIG. 6.

A BT (burn-in test) board 2 of an actual acceleration test has a structure shown in FIG. 7. Namely, a plurality of semiconductor devices 3 are positioned in first through n-th, columns on the BT board 2, where n represents an integer greater than two. When the data are read from the semiconductor devices 3, the external control signal OEB which corresponds to only one of the first through n-th columns of the semiconductor devices is changed from the high level to the low level. The external control signals OEB which correspond to the columns of the semiconductor devices 3 excepting the one of the first through n-th columns of the semiconductor devices 3 are held at the high level. Namely, the acceleration test is carried out to the columns of the semiconductor devices 3 excepting the one of the first through n-th columns of the semiconductor devices 3. After the convergence determination test has been carried out to one of the first through n-th columns of the semiconductor devices 3, the convergence determination test is carried out to another one of the first through n-th columns of the semiconductor devices 3. Likewise, the acceleration tests is carried out to the columns of the semiconductor devices 3 excepting the other one of the first through n-th columns of the semiconductor devices 3.

Thus, in case of carrying out the convergence determination test, the acceleration test is not interrupted.

Namely, it is possible to, at the same time, carry the convergence determination test and the acceleration test. As a result, it is possible to increase the frequency of the convergence determination test and to accurately carry out the convergence determination test. In addition, it is possible to decrease the total period of the acceleration test and convergence determination test.

Figure 8:
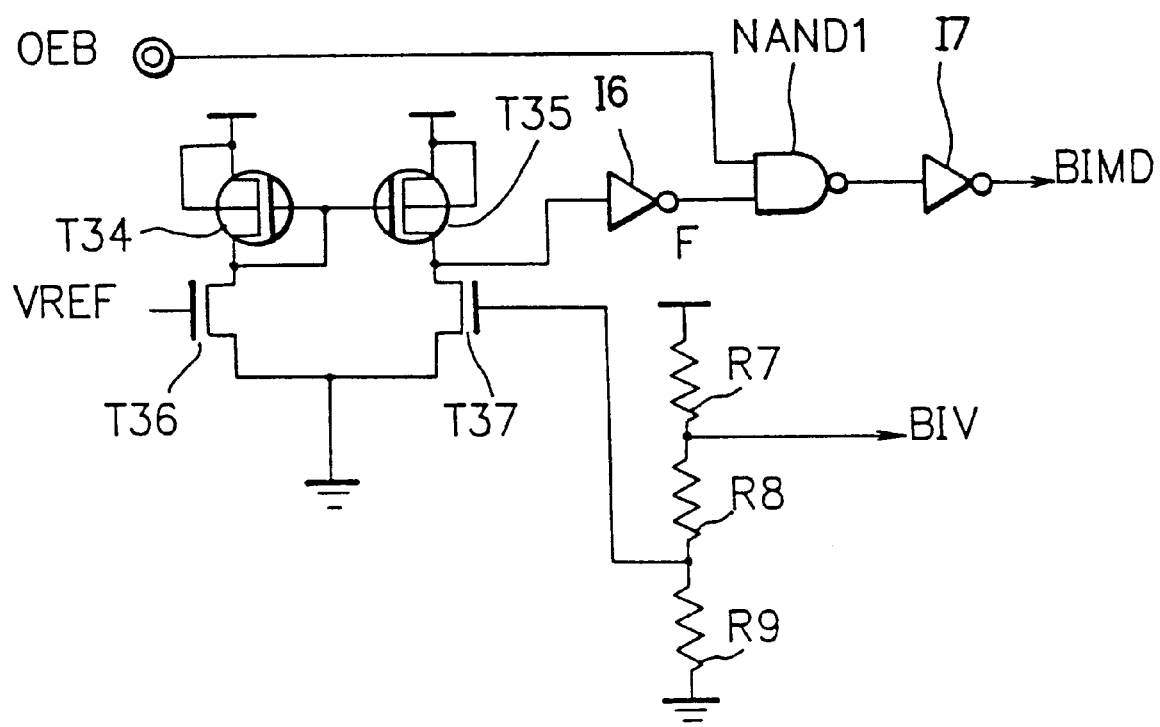
FIG. 8 is a circuit diagram of a semiconductor device according to a second embodiment of this invention.

Referring to FIG. 8, the description will proceed to a semiconductor device according to a second embodiment of this invention. Similar parts are designated by like reference numerals.

The semiconductor device comprises the P-channel MOSTs T34 and T35, the N-channel MOSTs T36 and T37, the resistors R7 to R9, an inverter I6, the NOT OR gate circuit NOR1, and an inverter I7. A node F of the P-channel MOST T35 and the N-channel MOST T37 is connected to an input terminal of the NOT OR gate circuit NOR1 through the inverter I6. Another input terminal of the NOT OR gate circuit NOR1 is supplied with the external control signal OEB. The inverter I7 is connected to an output terminal of the NOT OR gate circuit NOR1. The inverter I7 outputs the voltage BIMD. The voltage BIMD is supplied to the gate electrodes of the N-channel MOST T33 and the P-channel MOST T29 (FIG. 3).

At the time of the acceleration test, the voltage node F is changed from the high level to the low level and the inverter I6 supplies the high level to the input terminal of the NOT OR gate circuit NOR1. Therefore, an output voltage of the NOT OR gate circuit NOR1 is controlled by the external control signal OEB. When the external control signal OEB is set at the high level at the time of the acceleration test, the voltage BIMD becomes the high level. When the external control signal OEB is set at the low level at the time of the acceleration test, the voltage BIMD becomes the low level.

As a result, the N-channel MOST T33 (FIG. 3) becomes on when the voltage BIMD is the high level. Also, the N-channel MOST T33 becomes off when the voltage BIMD is the low level. As above mentioned, when the voltage BIMD is the high level, the level of the internal voltage VINT is changed to the level of the voltage BIV. When the voltage BIMD is the low level, the level of the internal voltage VINT is changed to the level of the voltage VREF.

In the semiconductor device according to the second embodiment, it is possible to, in the same manner above mentioned, carry out the acceleration test and convergence determination test.

Figure 9:
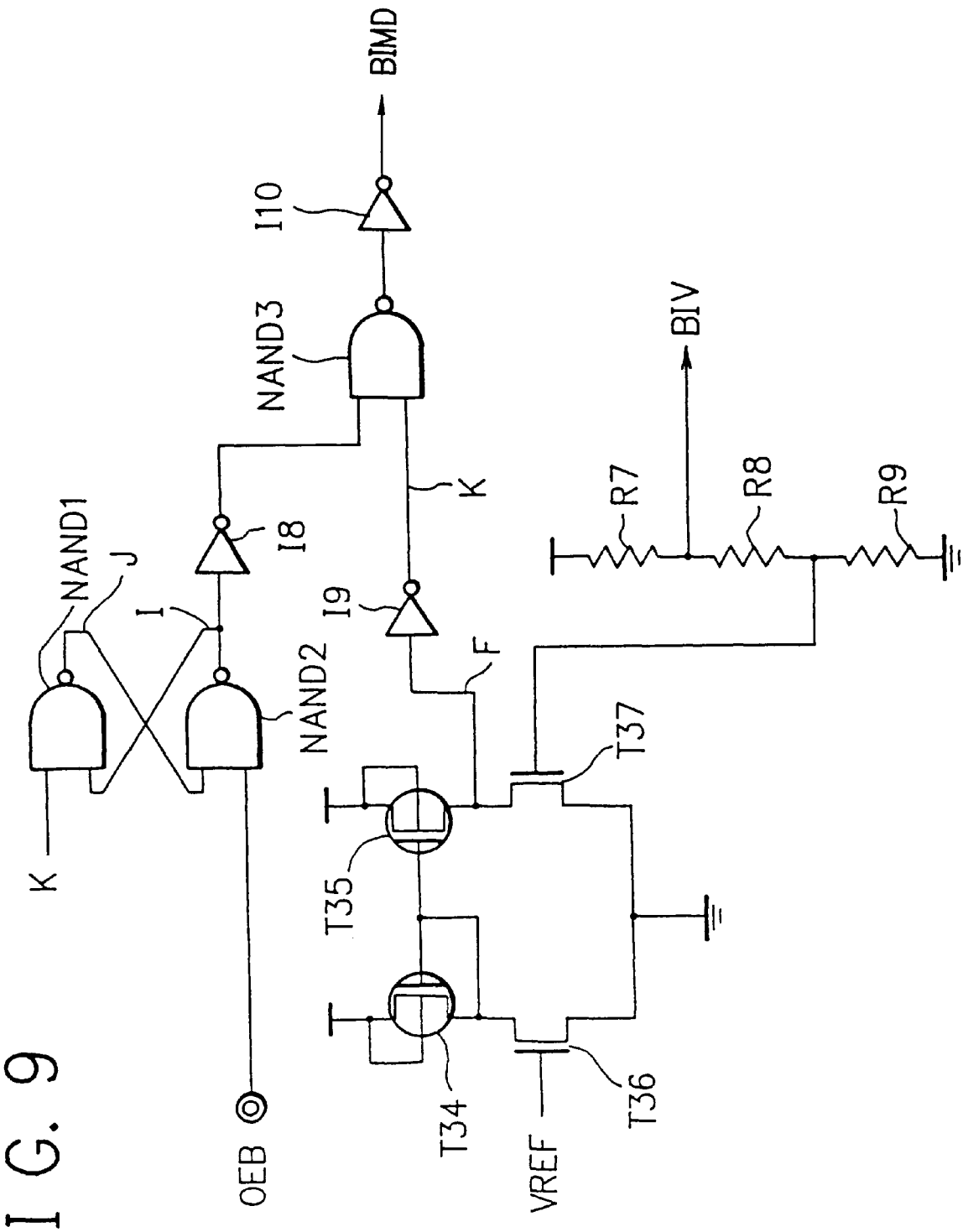
FIG. 9 is a circuit diagram of a semiconductor device according to a third embodiment of this invention.

Referring to FIG. 9, the description will proceed to a semiconductor device according to a third embodiment of this invention. Similar parts are designated by like reference numerals.

The semiconductor device comprises the P-channel MOSTs T34 and T35, the N-channel MOSTs T36 and T37, the resistors R7 to R9, an inverters I8, I9, and I10, and the NOT AND gate circuits NAND1, NAND2, and NAND3. A RS latch circuit is implemented by the NOT AND gate circuits NAND1 and NAND2. The node F of the P-channel MOST T35 and the N-channel MOST T37 is connected to an input terminal of the inverter I9. An output terminal of the inverter I9 is connected to an input terminal of the NOT AND gate circuit NAND3 through a node K. An input terminal of the NOT AND gate circuit NAND1 is supplied with a voltage of the node K. Another input terminal of the NOT AND gate circuit NAND1 is connected to an output terminal of the NOT AND gate circuit NAND2 through a node I. An input terminal of the NOT AND gate circuit NAND2 is supplied with the external control signal OEB. Another input terminal of the NOT AND gate circuit NAND2 is connected to an output voltage of the NOT AND gate circuit NAND1 through a node J. The output terminal of the NOT AND gate circuit NAND2 is connected to a input terminal of the inverter I8 through the node I. An output terminal of the inverter I8 is connected to another input terminal of the NOT AND gate circuit NAND3. An input terminal of the inverter I10 is connected to an output terminal of the NOT AND gate circuit NAND3. The inverter I10 outputs the voltage BIMD.

When the external voltage Vcc is lower than the predetermined voltage Vd, the voltage of the node K is held at the low level. Therefore, an output voltage of the NOT AND gate circuit NAND3 is the high level. Also, the voltage BIMD is the low level.

Next, when the external voltage Vcc is set at a voltage which is higher than the predetermined voltage Vd in order to carry out the acceleration test, the voltage of the node K is changed from the low level to the high level. In this event, since the two input terminal of the NOT AND gate circuit NAND3 is supplied with the high level. As a result, the voltage BIMD is changed from the low level to the high level. As above mentioned, when the voltage BIMD becomes the high level, the internal voltage VINT is changed to the level of the voltage BIV.

In this event, when the external control signal OEB is changed from the high level to the low level, a voltage of the node I is changed from the low level to the high level. As a result, the output voltage of the NOT AND gate circuit NAND3 is changed from the low level to the high level. Therefore, the voltage BIMD is changed from the high level to the low level. Consequently, when the voltage BIMD is changed from the high level to the low level even when the external voltage Vcc is set at the voltage which is higher than the predetermined voltage Vd, the internal voltage VINT becomes to the level of the voltage of the voltage VREF. Thereafter, when the external voltage Vcc is set at the voltage which is higher than the predetermined voltage Vd, the voltage of the node K is held at the high level. Also, the voltage of the node J, namely, the output voltage of the NOT AND gate circuit NAND1 is held at the low level and the voltage of the node I is held at the high level regardless of the external control signal OEB.

Next, when the external voltage Vcc is set at a voltage which is lower than the predetermined voltage Vd, the voltage of the node K is changed from the high level to the low level and the voltage of the node J is changed from the low level to the high level. When the voltage of the node J becomes the high level, the voltage of the node I is changed from the high level to the low level by the NOT AND gate circuit NAND2.

Next, when the external voltage Vcc is set at the voltage which is higher than the predetermined voltage Vd, the voltage BIMD becomes to the high level as above mentioned. Also, the internal voltage VINT is increased to the level of the voltage BIV.

Figure 10:
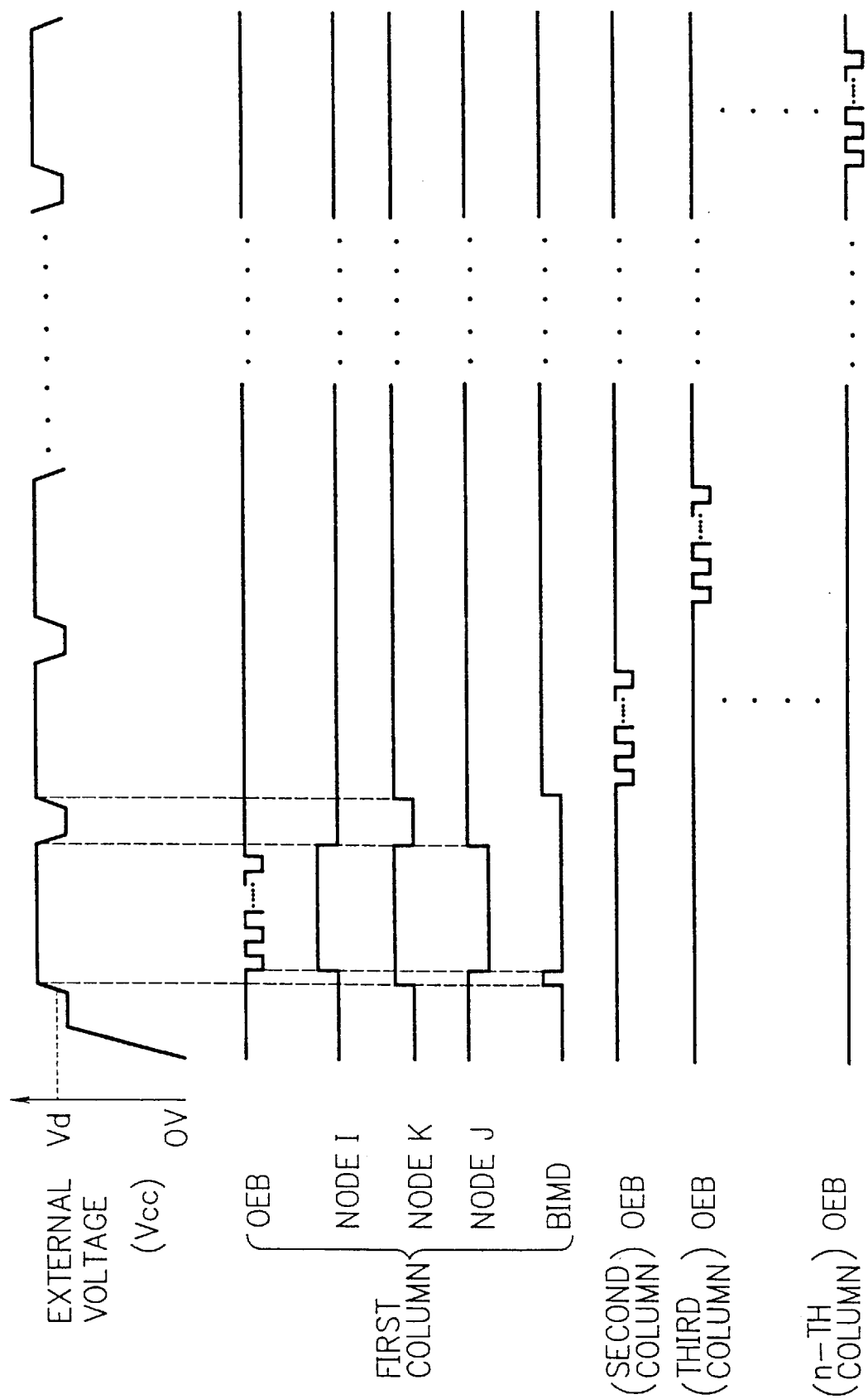
FIG. 10 is a view for use in describing operation of the semiconductor device illustrated in FIG. 9.

In the semiconductor device according to the third embodiment of this invention, it is possible to, in the same manner above mentioned, carry out the acceleration test and the convergence determination test. In this event, for example, the voltages of portions in the semiconductor device are shown in FIG. 10. In addition, for example, an output enable signal, a column address strobe signal (CASB signal), a test mode signal, and other signals are used as the external control signal OEB.

What is claimed is:

1. A semiconductor device which comprises:

an internal circuit supplied with an external voltage, said internal circuit being operated in an internal voltage having a high internal level and a low internal level; and voltage switching means for providing said low internal level to said internal circuit responsive to said external voltage being less than a predetermined voltage and, when said external voltage is above said predetermined voltage, switching to said high internal level and, from said high internal level to said low internal level in response to said external control signal.

2. A semiconductor device which comprises:

an internal circuit and which is supplied with an external voltage, said internal circuit being operated in an internal voltage having a high internal level and a low internal level;

means for selecting said low internal level responsive to said external voltage being below a predetermined level; and circumventing means for selecting said low internal level responsive to an external control signal regardless of said external voltage.

3. A semiconductor device which comprises:

an internal circuit supplied with an external voltage, said internal circuit being operated in an internal voltage having a high internal level and a low internal level;

voltage decreasing means for decreasing said high internal level of said internal voltage, said external voltage being below a predetermined level causing said voltage decreasing means to decrease of said internal voltage; and controlling means for controlling decrease of said internal voltage in response to an external control signal.

4. A semiconductor device which comprises:

an internal circuit supplied with an external voltage, said internal circuit being operated in an internal voltage having a high internal level and a low internal level;

voltage decreasing means for decreasing said high internal level of said internal voltage responsive to said external voltage being below a predetermined level;

external voltage detecting means for detecting that said external voltage is higher than said predetermined voltage;

controlling means for controlling, in response to an external control signal, said voltage decreasing means to decrease said internal voltage when said external voltage detecting means detects that said external voltage is higher than said predetermined voltage; and circumventing means for circumventing detection of said external voltage detecting means when said external voltage is higher than said predetermined voltage.

5. The semiconductor device recited in claim 1, wherein said voltage switching means provides said low internal level to said internal circuit responsive to said external voltage being less than a predetermined voltage regardless of a value of external control signal.

* * * * *